(12) United States Patent
Fackenthal

(10) Patent No.: US 11,501,814 B2
(45) Date of Patent: *Nov. 15, 2022

(54) PARALLEL ACCESS TECHNIQUES WITHIN MEMORY SECTIONS THROUGH SECTION INDEPENDENCE

(71) Applicant: Micron Technology, Inc., Boise, ID (US)

(72) Inventor: Richard E. Fackenthal, Carmichael, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/993,675

(22) Filed: Aug. 14, 2020

(65) Prior Publication Data

US 2020/0372944 A1 Nov. 26, 2020

Related U.S. Application Data

(63) Continuation of application No. 16/448,521, filed on Jun. 21, 2019, now Pat. No. 10,770,126, which is a continuation of application No. 15/066,573, filed on Mar. 10, 2016, now Pat. No. 10,373,665.

(51) Int. Cl.
*G11C 11/22* (2006.01)

(52) U.S. Cl.
CPC ........ *G11C 11/2273* (2013.01); *G11C 11/221* (2013.01); *G11C 11/2257* (2013.01); *G11C 11/2293* (2013.01)

(58) Field of Classification Search
CPC ............ G11C 11/2273; G11C 11/2257; G11C 11/221; G11C 11/2293
See application file for complete search history.

(56) References Cited

U.S. PATENT DOCUMENTS 5,086,412 A 2/1992 Jaffe et al.
5,598,374 A 1/1997 Rao
(Continued)

FOREIGN PATENT DOCUMENTS

CN 1637929 A 7/2005
CN 1689110 A 10/2005
(Continued)

OTHER PUBLICATIONS

ISA/KR International Search Report and Written Opinion of the International Searching Authority, Int'l. Appl. No. PCT/US2017/021199, Jun. 16, 2017, Seo-gu, Daejeon, Republic of Korea, 15 pgs.

(Continued)

*Primary Examiner* — Sung Il Cho
(74) *Attorney, Agent, or Firm* — Holland & Hart LLP

(57) ABSTRACT

A memory device having a plurality sections of memory cells, such as ferroelectric memory cells (hybrid RAM (HRAM) cells) may provide for concurrent access to memory cells within independent sections of the memory device. A first memory cell may be activated, and it may be determined that a second memory cell is independent of the first memory cell. If the second memory cell is independent of the first memory cell, the second memory cell may be activated prior to the conclusion of operations at the first memory cell. Latching hardware at memory sections may latch addresses at the memory sections in order to allow a new address to be provided to a different section to access the second memory cell.

20 Claims, 12 Drawing Sheets

(56) References Cited

U.S. PATENT DOCUMENTS

| | | | |
|---|---|---|---|
| 5,973,991 A | 10/1999 | Tsuchida et al. | |
| 6,125,432 A | 9/2000 | Hanami et al. | |
| 6,154,414 A | 11/2000 | Lee | |
| 6,263,398 B1 | 7/2001 | Taylor et al. | |
| 6,392,935 B1 | 5/2002 | Mulholland | |
| 6,477,098 B1 | 11/2002 | Raad | |
| 6,580,656 B2 | 6/2003 | Lee | |
| 6,972,983 B2 | 12/2005 | Roehr et al. | |
| 7,088,605 B2 | 8/2006 | Lin | |
| 7,301,795 B2 | 11/2007 | Fong et al. | |
| 7,355,912 B2 | 4/2008 | Park | |
| 9,236,112 B1 | 1/2016 | Raad et al. | |
| 10,373,665 B2* | 8/2019 | Fackenthal | G11C 11/2257 |
| 10,770,126 B2* | 9/2020 | Fackenthal | G11C 11/2273 |
| 2001/0028579 A1 | 10/2001 | Toda et al. | |
| 2002/0095544 A1 | 7/2002 | Lee | |
| 2002/0176307 A1 | 11/2002 | Jung et al. | |
| 2003/0142531 A1 | 7/2003 | Kang et al. | |
| 2003/0174573 A1 | 9/2003 | Suzuki et al. | |
| 2004/0006441 A1* | 1/2004 | Riekes | G11C 29/02 702/118 |
| 2004/0125641 A1 | 7/2004 | Kang | |
| 2004/0196725 A1 | 10/2004 | Kang | |
| 2006/0002169 A1 | 1/2006 | Lin | |
| 2006/0171234 A1 | 8/2006 | Liu et al. | |
| 2009/0119567 A1* | 5/2009 | Kawabata | G06F 11/1032 714/763 |
| 2009/0238019 A1 | 9/2009 | Kim | |
| 2013/0265834 A1 | 10/2013 | Vankayala et al. | |
| 2015/0200015 A1 | 7/2015 | Kim | |
| 2015/0332740 A1 | 11/2015 | Venkata | |
| 2016/0240242 A1 | 8/2016 | Son et al. | |

FOREIGN PATENT DOCUMENTS

| | | |
|---|---|---|
| CN | 103871452 A | 6/2014 |
| JP | H11317072 A | 11/1999 |
| JP | 2000090664 A | 3/2000 |
| JP | 2000251465 A | 9/2000 |
| JP | 2002367375 A | 12/2002 |
| JP | 2004-213856 A | 7/2004 |
| JP | 2010146678 A | 7/2010 |

OTHER PUBLICATIONS

Taiwanese Intellectual Property Office, "Office Action," issued in connection with Application No. 106108062, dated Dec. 15, 2017 (5 pages).

Japanese Patent Office, "Notice of Rejection," issued in connection with Japanese Patent Application No. 2018-546801, dated Dec. 17, 2019 (12 pages).

The Korean Intellectual Property Office, "Notice of Reasons for Rejection," issued in connection with Korean Patent Application No. 10-2018-7028495, dated Feb. 13, 2020 (4 pages).

European Patent Office, "European Search Report," issued in connection with European Patent Application No. 17763926.7, dated Nov. 26, 2019 (7 pages).

Japanese Patent Office, "Notice of Rejection," issued in connection with Japanese Patent Application No. 2018-546801, dated Sep. 15, 2020 (13 pages).

Japan Patent Office, "Office Action," issued in connection with Japan Patent Application No. 2021-085029 dated May 24, 2022 (15 pages).

China National Intellectual Property Administration, "First Office Action," issued on connection with Chinese Patent Application No. 201780025554.9, dated Oct. 27, 2021 (4 pages).

* cited by examiner

PARALLEL ACCESS TECHNIQUES WITHIN MEMORY SECTIONS THROUGH SECTION INDEPENDENCE

CROSS REFERENCE

The present application for patent is a continuation of U.S. patent application Ser. No. 16/448,521 by Fackenthal, entitled "Parallel Access Techniques Within Memory Sections Through Section Independence," filed Jun. 21, 2019, which is a continuation of U.S. patent application Ser. No. 15/066,573 by Fackenthal, entitled "Parallel Access Techniques Within Memory Sections Through Section Independence," filed Mar. 10, 2016, assigned to the assignee hereof, and each of which is expressly incorporated by reference in its entirety herein.

BACKGROUND

The following relates generally to memory devices and more specifically to techniques for concurrently accessing memory cells within independent sections of a memory array.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Multiple types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. In FeRAM devices, a higher voltage may be applied to polarize a memory cell than would be applied in a volatile RAM memory cell (e.g., a DRAM cell with a dielectric capacitor), due to the ferroelectric capacitor having relatively high voltages for polarization. Such higher voltages may result in relatively longer times for polarizing the memory cell due to increased times to charge to such a higher voltage (e.g., via charge pumping). In order to mitigate such relatively high voltages, some designs may move a plate voltage associated with a memory cell in an opposite direction as a voltage at a digit line of the memory cell, thus creating a polarization bias that may be used to operate the cell. However, such movement of the plate voltage causes a bifurcated writeback of ones and zeros to cells, as logical "zeros" are written when the plate voltage is high, and logical "zeros" are written when the plate voltage is low. Such a bifurcated writeback may also increase times for writing to a memory relative to volatile RAM, thus increasing average access times for a memory. Accordingly, techniques for reducing access times may enhance the performance of nonvolatile FeRAM devices.

BRIEF DESCRIPTION OF THE DRAWINGS

Embodiments of the disclosure are described with reference to the following figures.

DETAILED DESCRIPTION

The disclosed techniques relate to a memory device having a plurality of sections of memory cells (e.g., ferroelectric memory cells (hybrid RAM (HRAM) cells) that provides for concurrent access to memory cells within independent sections of the memory device. In some examples, a first memory cell may be activated, and it may be determined that a second memory cell is independent of the first memory cell. If the second memory cell is independent of the first memory cell, the second memory cell may be activated prior to the conclusion of operations at the first memory cell. For example, the second memory cell may be activated during a precharge operation at the first memory cell. In some examples, the second memory cell may be determined to be independent of the first memory cell when a section of the second memory cell does not share certain components (e.g., sense amplifier components) with a section of the first memory cell (e.g., the first and second memory cells are in independent sections, as discussed in more detail below). In some examples, latching hardware may be provided at memory sections to latch read addresses at the memory sections in order to allow a new read address to be provided to a different section to access the second memory cell. In certain examples, a delay time for activating the second memory cell may be selected based on whether the second memory cell is independent of the first memory cell.

Embodiments of the disclosure introduced above are further described below in the context of a memory device that may provide concurrent access to memory cells within independent sections of the memory device. Specific examples of a hybrid memory are then described. These and other embodiments of the disclosure are further illustrated by and described with reference to apparatus diagrams, system diagrams, and flowcharts that relate to the configuration, operation, and use of a memory device that may provide concurrent access to memory cells within independent sections of the memory device.

Figure 1:
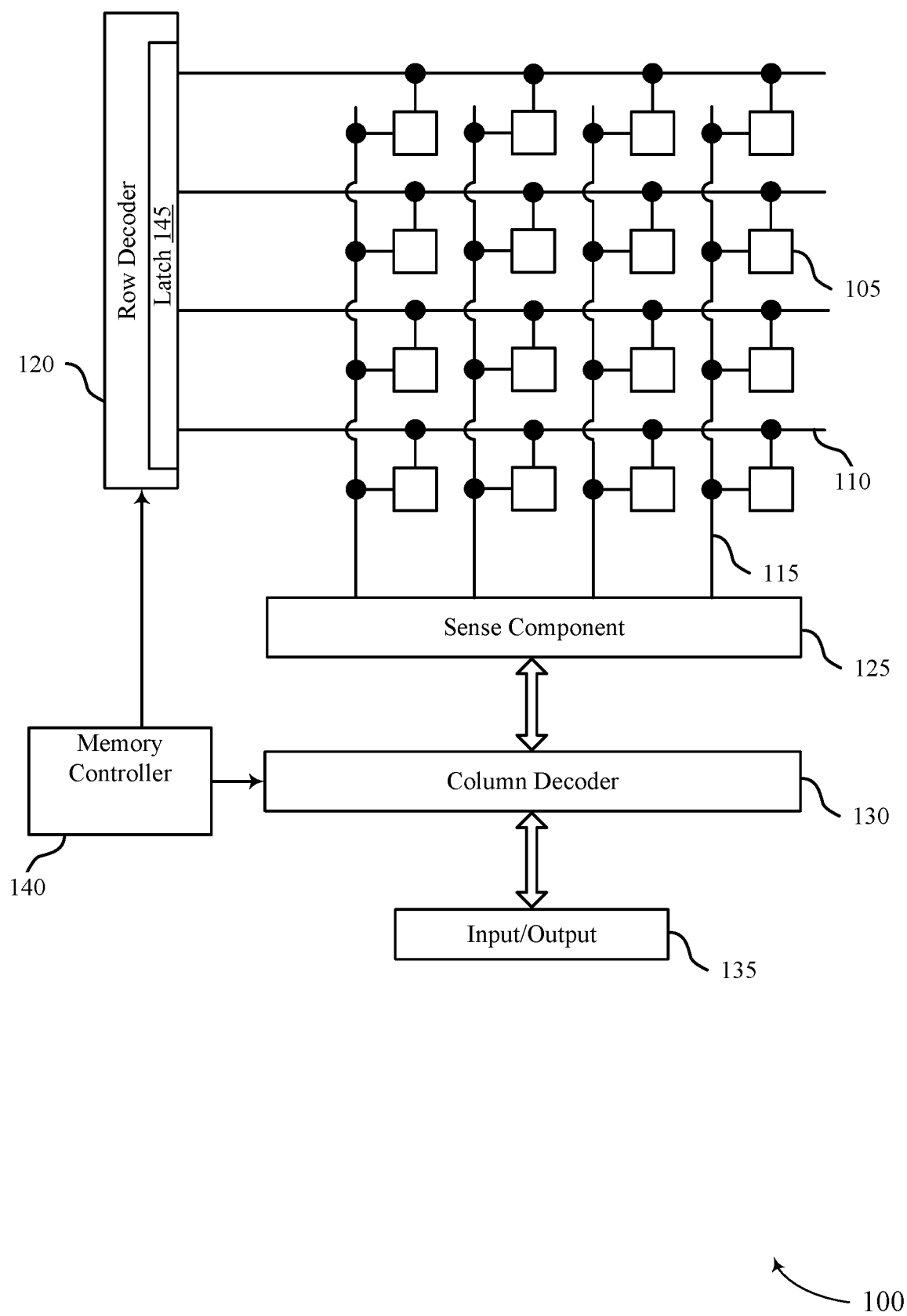
FIG. 1 illustrates an example memory array that supports concurrent access of memory cells within independent sections of a memory array in accordance with various embodiments of the present disclosure.

FIG. 1 illustrates an example memory array 100 in accordance with various embodiments of the present disclosure. The memory array 100 may represent, for example, a portion of a section of memory cells in a memory bank. Memory array 100 includes memory cells 105 that are programmable to store different states. Each memory cell 105 may be programmable to store two states, denoted a logic 0 and a logic 1. In some cases, memory cell 105 is configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Ferroelectric materials have non-linear polarization properties, the details and advantages of a ferroelectric memory cell 105 are discussed below.

Operations such as reading and writing may be performed on memory cells 105 by activating or selecting the appropriate word line 110 and digit line 115. Activating or selecting a word line 110 or a digit line 115 may include applying a voltage potential to the respective line. In some cases, a digit line 115 may be referred to as a bit line. Word lines 110 and digit lines 115 may be made of conductive materials. In some examples, word lines 110 and digit lines 115 are made of metals (e.g., copper, aluminum, gold, tungsten, etc.). Each row of memory cells 105 are connected to a single word line 110, and each column of memory cells 105 are connected to a single digit line 115. By activating one word line 110 and one digit line 115, a single memory cell 105 may be accessed at their intersection. The intersection of a word line 110 and digit line 115 may be referred to as an address of a memory cell.

In some architectures, the logic storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed. A latch 145 may, in some examples, latch the row address from the memory controller 140, which may allow memory controller 140 to perform at least a portion of an access (e.g., a read or write operation) of another independent memory array during a portion of the access of the memory array 100, as will be discussed in more detail below.

Upon accessing, a memory cell 105 may be read, or sensed, by sense component 125. For example, sense component 125 may compare a signal, e.g., a voltage, of the relevant digit line 115 to a reference signal (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some designs, two adjacent memory arrays 100 may share common sense components 125, and memory cells 105 of different memory arrays 100 may be independent if they are not coupled with common sense components 125. Thus, a memory cell 105 may be considered to be independent of other memory cells of non-adjacent memory arrays 100, according to some examples.

A memory cell 105 may be set, or written, by similarly activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed herein, ferroelectric memory cells may have beneficial properties that may result in improved performance relative to other memory architectures.

The memory controller 140 may control the operation (read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state. In some examples described herein, two or more memory arrays 100 may be concurrently accessed in order to enhance the speed at which read/write operations may be performed.

Figure 2:
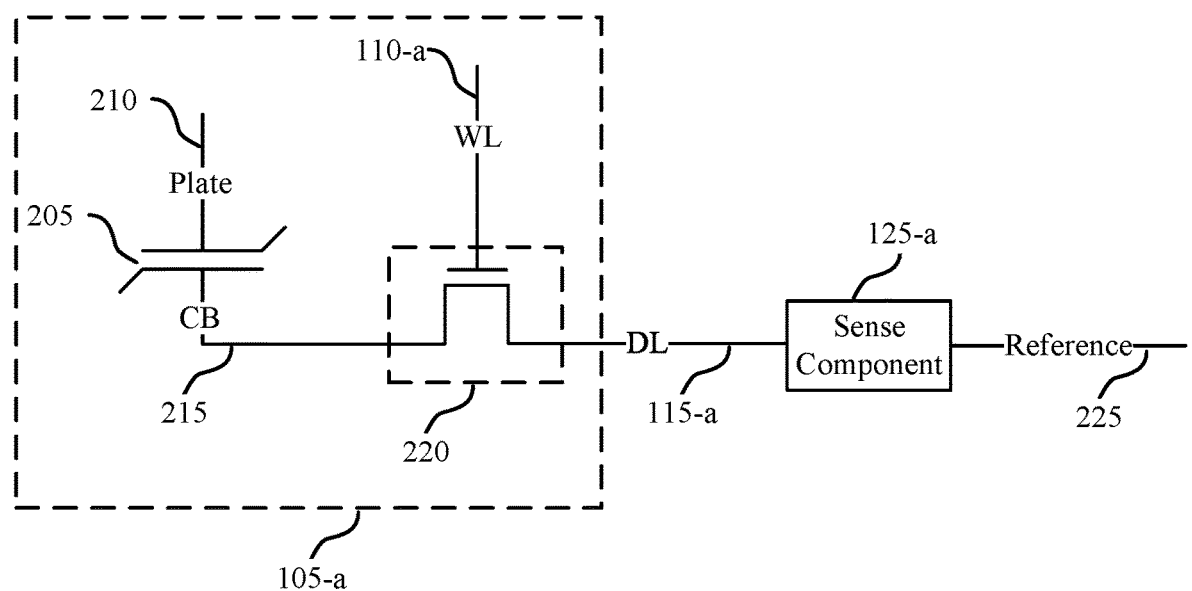
FIG. 2 illustrates an example circuit of a memory cell that supports concurrent access of memory cells within independent sections of a memory array in accordance with various embodiments of the present disclosure.

FIG. 2 illustrates an example circuit 200 for memory storage in accordance with various embodiments of the present disclosure. Circuit 200 may include a ferroelectric memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Circuit 200 includes a logic storage component, such as capacitor 205 that includes two conductive terminals, cell plate 210 and cell bottom 215. These terminals may be separated by an insulating ferroelectric material. As described above, various states may be stored by charging or discharging capacitor 205.

The stored state of capacitor 205 may be read or sensed by operating various elements represented in circuit 200. Capacitor 205 may be in electronic communication with digit line 115-*a*. Capacitor 205 may thus be isolated from the digit line 115-*a* when selection component 220 is deactivated, and capacitor 205 may be connected to digit line 115-*a* via selection component 220 when selection component 220 is activated. In some cases, selection component 220 may be a transistor and its operation may be controlled by applying a voltage to the transistor gate, where the voltage magnitude is greater than the threshold magnitude of the transistor. Word line 110-*a* may activate selection component 220; for example, a voltage applied to word line 110-*a* may be applied to the transistor gate, connecting capacitor 205 with digit line 115-*a*.

In the example depicted in FIG. 2, capacitor 205 is a ferroelectric capacitor. Due to the ferroelectric material between the plates of capacitor 205, and as discussed in more detail below, capacitor 205 may not discharge upon connection to digit line 115-*a*. Instead, plate 210 may be biased by an external voltage, resulting in a change in the stored charge on capacitor 205. The change in stored charge depends on the initial state of capacitor 205, i.e., if the initial state stored a logic 1 or a logic 0. The change in stored charge may then be compared to a reference (e.g., a reference voltage) by sense component 125-*a* in order to determine the stored logic state in memory cell 105-*a*.

The specific sensing scheme or process may take many forms. In one example, digit line 115-*a* may have an intrinsic capacitance and develop a non-zero voltage as capacitor 205 charges or discharges in response to the voltage applied to plate 210. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of pF). The subsequent voltage of digit line 115-*a* may depend on the initial logic state of capacitor 205, and sense component 125-*a* may compare this voltage to a reference voltage.

To write memory cell 105-*a*, a voltage potential may be applied across capacitor 205. Various methods may be used. In one example, selection device 220 may be activated through word line 110-*a* in order to electrically connect capacitor 205 to digit line 115-*a*. A voltage may be applied across capacitor 205 by controlling the voltage of plate 210 and cell bottom 215 through digit line 115-*a*. To write a logic 0, plate 210 may be taken high, that is, a positive voltage may be applied, and cell bottom 215 may be taken low, i.e., connected to ground, virtually grounded, or negative voltage may be applied. The opposite is performed to write a logic 1, i.e., plate 210 is taken low and cell bottom 215 is taken high.

As discussed above, capacitor 205 in the example of FIG. 2 is a ferroelectric capacitor, and may have a voltage required to polarize the cell that is higher than the voltage for charging a dielectric capacitor. For example, in some designs the polarization voltage for ferroelectric capacitor 205 may be three times, or more, than the voltage to charge a dielectric capacitor. In architectures in which ferroelectric memory is desired to be a replacement for traditional DRAM, higher voltage at a voltage source may not be readily available, and thus in order to have sufficient voltage at the capacitor 205, voltages at both the plate 210 and the digit line 115-*a* may be moved to provide sufficient bias across the capacitor 205. Such movement of the plate 210 voltage may result in bifurcated write operations, in which logical "0s" may be written when the plate 210 is at a high voltage, and then the plate 210 moved to a low voltage and logical "1s" may be written. Such a bifurcated write process may result in additional time that may be required for completely write data to a memory, and various techniques as discussed herein may initiate a portion of an access to a memory cell, such as memory cell 105-*a*, concurrently with performing a portion of the bifurcated write process.

Figure 3:
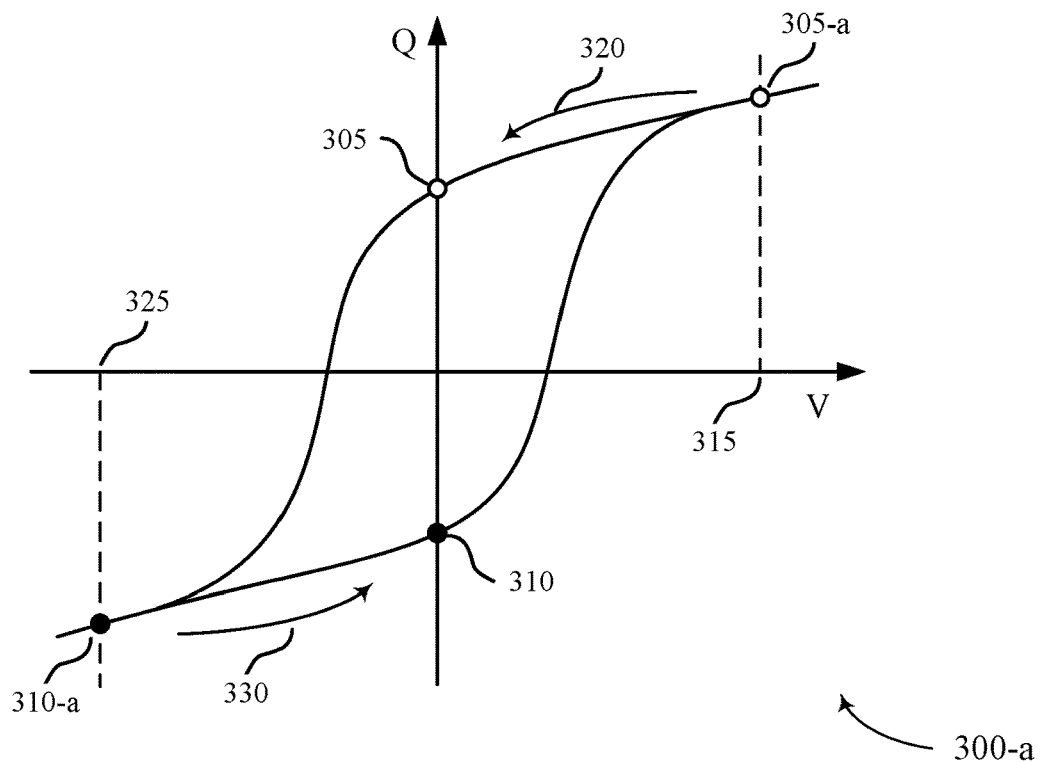
FIG. 3 illustrates example hysteresis plots for operating a ferroelectric memory cell in accordance with various embodiments of the present disclosure.
Figure 3:
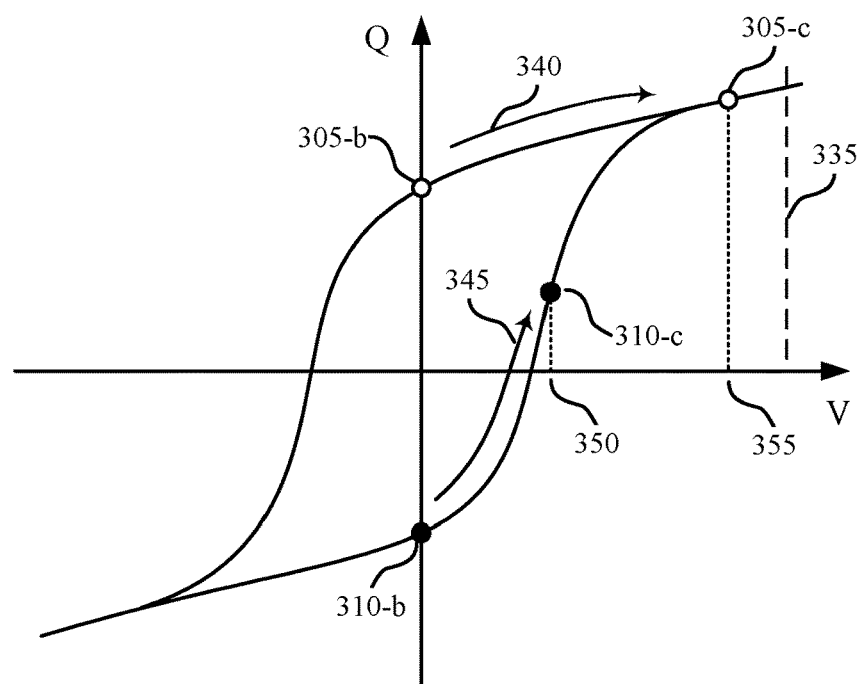

FIG. 3 illustrates example hysteresis plots 300 for a ferroelectric memory cell that supports concurrent access to independent memory cells in accordance with various embodiments of the present disclosure. Hysteresis curves 300-*a* and 300-*b* illustrate an example ferroelectric memory cell writing and reading process, respectively. Hysteresis curves 300 depict the charge, Q, stored on the ferroelectric capacitor as a function of a voltage potential difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal. Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question and maintaining the second terminal at ground. A negative voltage may be applied by maintaining the terminal in question at ground and applying a positive voltage to the second terminal, i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-b or 310-b was initially stored. For example, hysteresis curve 300-b illustrates two possible stored charge states 305-b and 310-b. Net voltage 335 may be applied across the capacitor. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing operation and circuitry.

In some cases, the final charge may depend on the intrinsic capacitance of the digit line of a memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis, i.e., charge states 305-c and 310-c may be defined with respect to the digit line capacitance. As a result, the voltage of the capacitor, voltage 350 or voltage 355, may be different and may depend on the initial state of the capacitor.

By comparing voltage 350 or voltage 355 to a reference voltage, the initial state of the capacitor may be determined. For example, the reference voltage may be an average of voltage 350 and 355 and, upon comparison, the sensed voltage may be determined to be higher or lower than the reference voltage. A value of the ferroelectric cell (i.e., a logic 0 or 1) may then be determined based on the comparison.

As discussed above, reading a memory cell 105 may degrade or destroy the stored logic. However, a ferroelectric memory cell 105 may maintain the initial logic state after a read operation. For example, if charge state 305-b is stored and the read operation performed, the charge state may return to initial charge state 305-b after voltage 335 is removed, for example, by following path 340 in the opposite direction. Thus, when reading a ferroelectric memory cell 105 the charge contained in the cell does not 'freely' flow out of the cell onto a floating node (e.g., a digit line 115) during sensing, rather the memory cell 105 must be actively biased and polarized for a polarization current to flow. Two options for doing this are illustrated in FIGS. 4A and 4B.

Figure 4A:
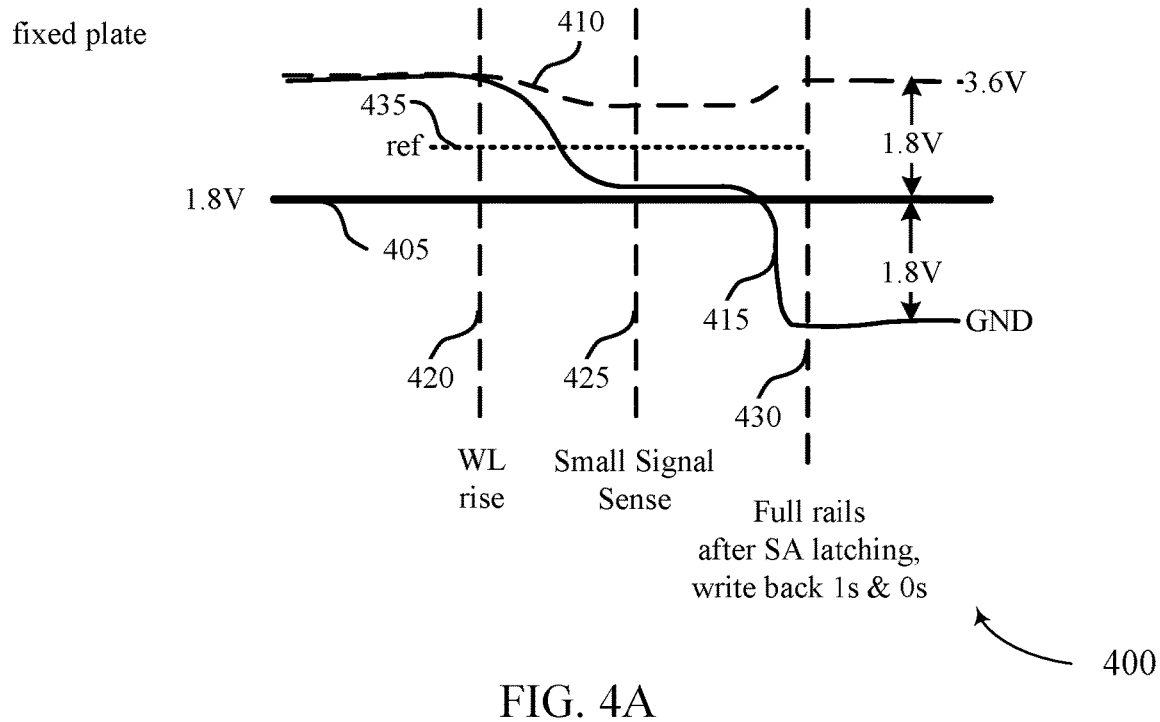
FIG. 4A illustrates a timing diagram for an example of memory cell voltages in a memory cell having a fixed plate voltage for memory cell operation in accordance with various embodiments of the present disclosure.

FIG. 4A illustrates a timing diagram for an example 400 of memory cell voltages in a memory cell (e.g., a memory cell 105 of FIG. 1 or 2) having a fixed plate voltage for memory cell operation, in accordance with various embodiments of the present disclosure. In the example of FIG. 4A, a plate voltage 405 may remain fixed at a certain value, such as 1.8 V for example. A word line voltage may rise at 420 and a first digit line (DL0) voltage 410 for a cell having a "0" may remain at a voltage above a reference voltage 435 during a small signal sense 425. The DL0 voltage 410 may move to a full rails voltage of 3.6 V in this example after sense amplifier (SA) latching at 430. A second digit line (DL1) voltage 415 for a cell having a "1" may, following word line rise 420, move below the reference voltage 435 to a value near the fixed plate voltage during small signal sense 425, and may then drop to a ground value after sense amplifier (SA) latching at 430. Following SA latching at 430, both "1s" and "0s" may be written back to the memory cell. Memory cells that operate as such a fixed plate voltage may have less overhead related to moving plate voltage and may not require a bifurcated write back. However, such a fixed plate voltage may be significantly higher than plate voltages of DRAM (e.g., 1.8 V for the example of FIG. 4A versus 0.6 V for many DRAM architectures). Such higher voltages may result in larger and/or slower devices that have relatively high power consumption.

Figure 4B:
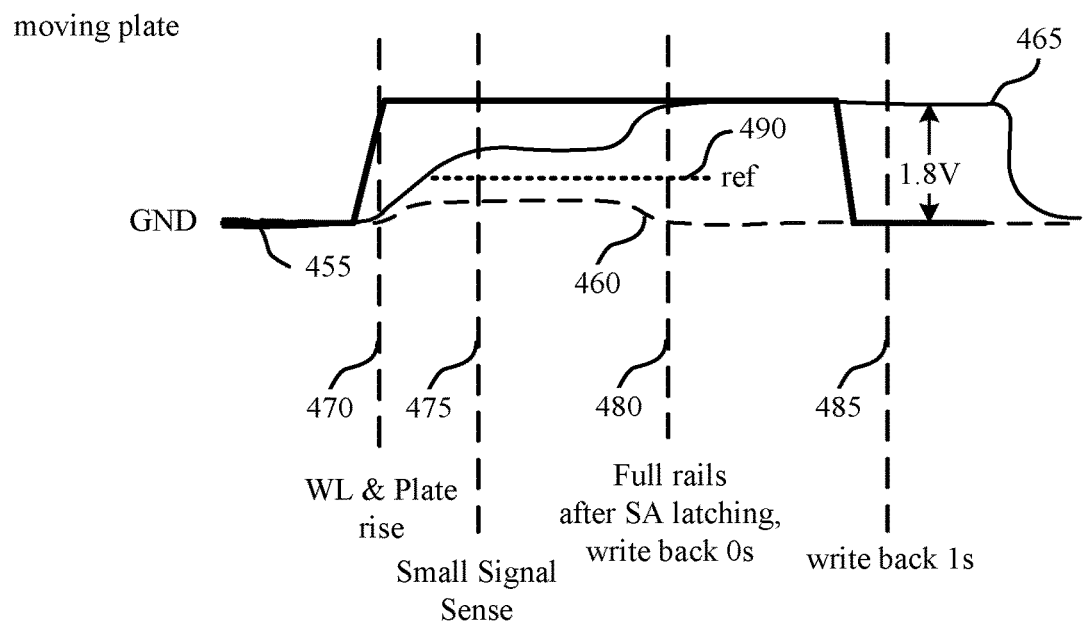
FIG. 4B illustrates a timing diagram for an example of memory cell voltages in a memory cell having a moving plate voltage for memory cell operation in accordance with various embodiments of the present disclosure.

FIG. 4B illustrates a timing diagram for an example 450 of memory cell voltages in a memory cell (e.g., a memory cell 105 of FIG. 1 or 2) having a moving plate voltage for memory cell operation in accordance with various embodiments of the present disclosure. In the example of FIG. 4B, a plate voltage 455 may be moved from a low value (e.g., ground as illustrated in FIG. 4B) to a high value (e.g., 1.8 V as illustrated in FIG. 4B) when activating the cell to sense stored values. In the example of FIG. 4B, a word line voltage and plate voltage may rise at 470 and a first digit line (DL0) voltage 460 for a cell having a "0" may remain at a voltage below a reference voltage 490 during a small signal sense 475. The DL0 voltage 400 may move to a full rails low voltage (e.g., Ground) in this example after sense amplifier (SA) latching at 480. A second digit line (DL1) voltage 465 for a cell having a "1" may, following word line rise 470, move to a value above the reference voltage 490 during small signal sense 475, and may then rise to the plate voltage value after sense amplifier (SA) latching at 480. Following SA latching at 480, "0s" may be written back to the memory cell. Plate voltage 455 may be moved back down, and "1s" may be written back to the memory cell at 485. As mentioned above, such a moving plate results in a two-phase, or bifurcated, write back in which only the "0s" get a write-back while the plate is high, after which the plate voltage goes low and the "1s" get a write-back. Such a design allows for lower absolute operating voltages (e.g., 1.8V instead of the 3.6V of FIG. 4A), which may allow for smaller and faster devices with relatively lower power consumption. However, also as mentioned above, such a bifurcated write results in a portion of the write being completed upon a Precharge (PRE) command, and a delay associated with the row precharge command ($t_{RP}$) before activating a memory cell of a subsequent memory operation may be relatively long. Accordingly, in some examples, memory cells that are independent of one another and that are involved with successive commands may have concurrent operation for at least a portion of the process, and thus may provide enhanced speed. Such examples may use a first $t_{RP}$ value for successive writes when memory cells are independent, and may use a second $t_{RP}$ value for successive writes when the memory cells are not independent. A first delay time for the first $t_{RP}$, which may be referred to as $t_{RP\text{-}fast}$ may be shorter than a second delay time for the second $t_{RP}$, which may be referred to as $t_{RP\text{-}slow}$.

Figure 5A:
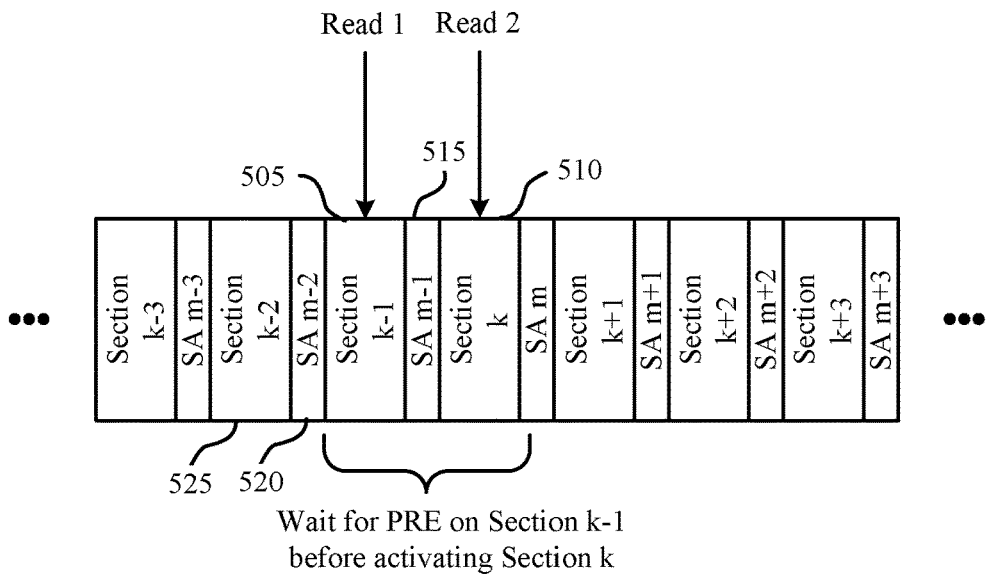
FIGS. 5A and 5B illustrate example of memory sections that may be accessed for successive read operations in accordance with various embodiments of the present disclosure.

FIG. 5A illustrates an example 500 of memory sections that may be serially accessed for successive read operations in accordance with various embodiments of the present disclosure. In this example, memory section k−1 505 may be adjacent to memory section k 510 and memory section k−2 525. In this example, adjacent memory sections may share sense amplifier (SA) components, with SA m−1 515 being shared between memory section k 510 and memory section k−1 505. Thus, memory section k 510 and memory section k−1 505 are coupled with at least partially overlapping SA components of SA m−1 515, and these memory sections are not independent of each other. Similarly, SA m−2 520 may be shared between memory section k−1 505 and memory section k−2 525. If a first read (Read 1) is received for memory cells located in memory section k−1 505, and a second read (Read 2) is received for memory cells located in memory section k 510, the memory cells for Read 1 and Read 2 would not be independent since both memory sections 505, 510 share SA m−1 515. In such a case, a memory controller (e.g., memory controller 140 of FIG. 1) may wait for the precharge operation at memory section k−1 505 to be completed before activating memory section k 510. A delay time for initiating Read 2 in this example may be set to a $t_{RP\text{-}slow}$ delay time. In the event that a third read request were to be received to access a non-adjacent memory section to memory section k 510, the delay time for initiating the third read request may be set to a $t_{RP\text{-}fast}$ delay time to initiate an activation following the second read request and during a precharge operation associated with the second read request, in a manner such as described with respect to FIG. 5B.

Figure 5B:
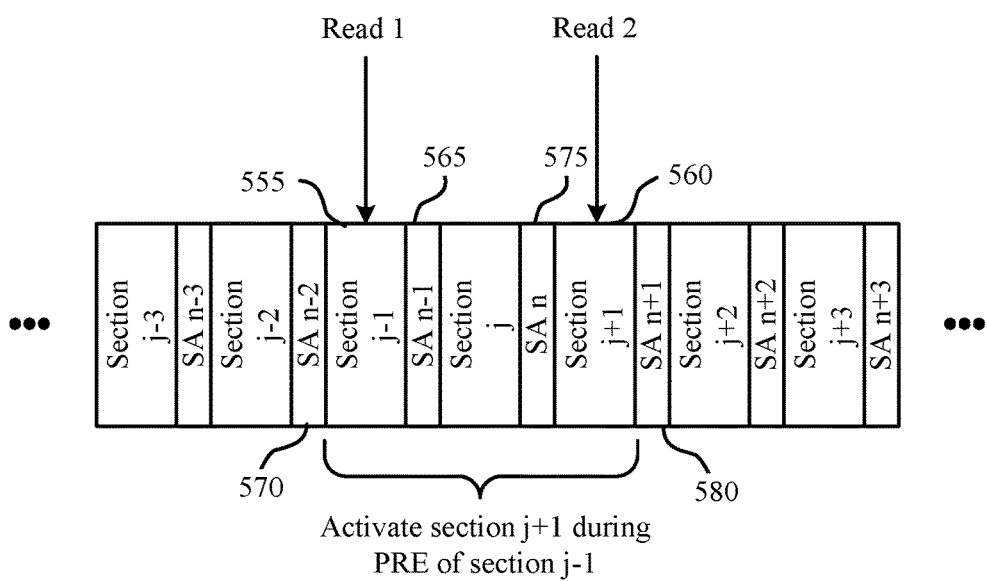

FIG. 5B illustrates an example 550 of memory sections that may be concurrently accessed for successive read operations in accordance with various embodiments of the present disclosure. In this example, memory section j−1 555 may receive a first read request (Read 1), and memory section j+1 560 may receive a second read request (Read 2). As memory section j−1 555 and memory section j+1 560 are not adjacent, Read 2 operations may be initiated during a precharge operation of Read 1. More specifically, memory section j−1 555 may use SA n−1 565 and SA n−2 570, while memory section j+1 may use SA n 575 and SA n+1 580. Since none of the SAs 565-580 are common between memory section j−1 555 and memory section j+1 560, these memory sections are independent of each other and operations at memory section j+1 560 may be started without impacting the completion of the PRE command at memory section j−1 555. A delay time for initiating Read 2 in this example may be set to a $t_{RP\text{-}fast}$ delay time.

While the embodiments of FIG. 5A and FIG. 5B show an architecture where adjacent sections may share one or more components (e.g., adjacent sections share SA components), in other embodiments at least some memory sections may have dedicated SA components that are not shared with other memory sections. In such other embodiments, each of the memory sections with dedicated SA components would be independent of each other, and memory cells located in different sections would be independent even if located in adjacent memory sections. Likewise, memory cells within a same section in such embodiments would not be independent of each other, similarly as such cells within a same section would not be independent of each other in the embodiment of FIGS. 5A and 5B.

Figure 6:
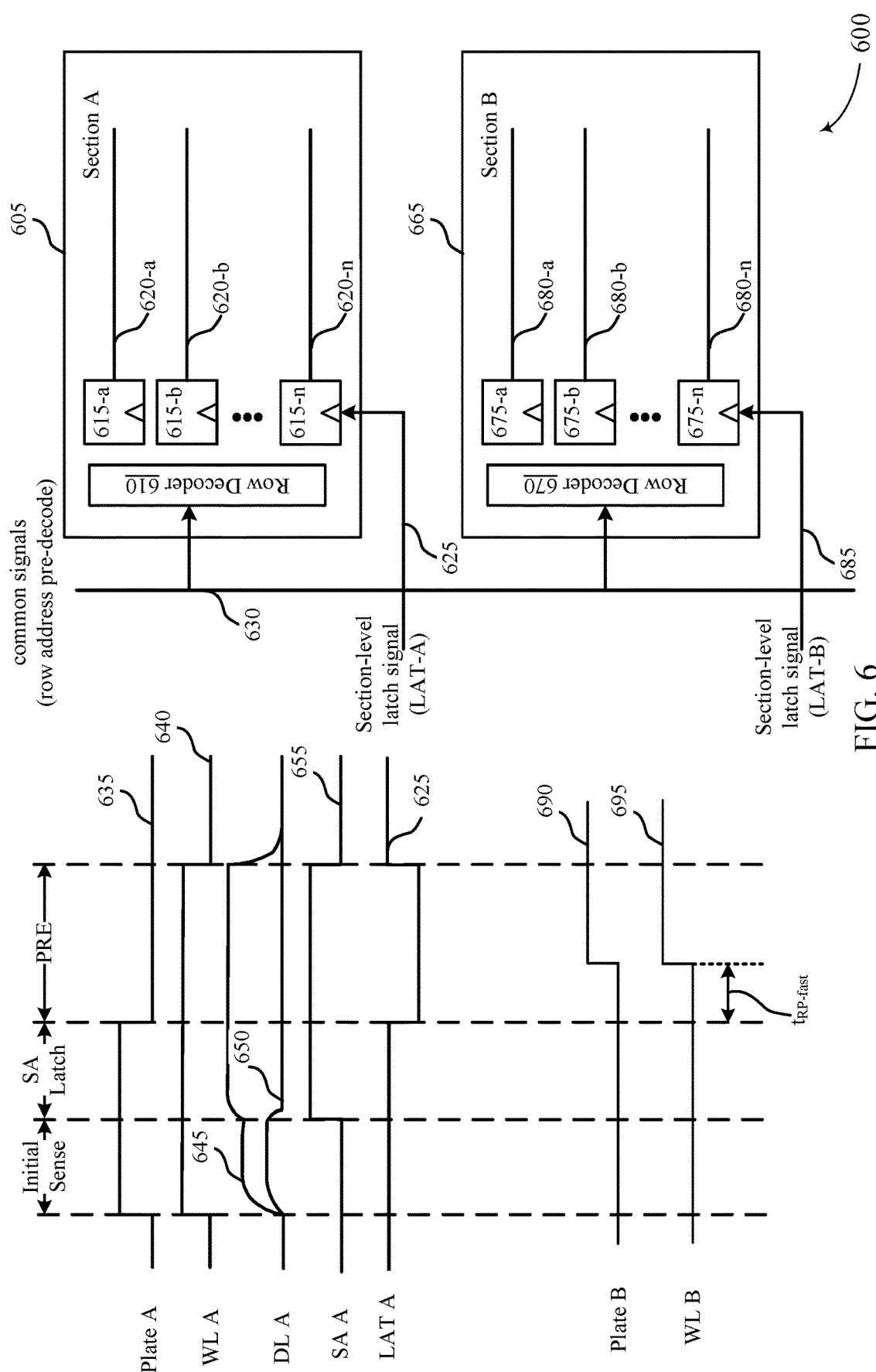
FIG. 6 illustrates an example of memory sections and related components, with a timing diagram for operating the memory sections for concurrent access in accordance with various embodiments of the present disclosure.

FIG. 6 illustrates an example 600 of memory sections and related components, with a timing diagram for operating the memory sections for concurrent access in accordance with various embodiments of the present disclosure. In this example, a first memory section (section A) 605 and a second memory section (section B) 665 are illustrated, which may be examples of a memory array 100 of FIG. 1 or memory sections 505, 510, 525, 555, or 560 of FIG. 5, and may include arrays of memory cells such as memory cells 105 of FIGS. 1-2. First memory section 605 may include a row decoder 610 which may be an example of row decoder 120 of FIG. 1, latches 615-a through 615-n, which may be an example of latch 145 of FIG. 1, and a set of rows of memory cells 620-a through 620-n. Row decoder 610 may receive a row address through common signals 630 from, for example, a memory controller (e.g., memory controller 140 of FIG. 1). A section level latch signal (LAT-A) 625 may be provided to latches 615 when a row address is to be latched in order to allow another memory section, such as second memory section 665, to be activated. Latches 615 may retain an existing row address at the first memory section 605 and a new row address may be provided in common signals 630 to row decoder 610. Similarly, second memory section 665 may include row decoder 670, latches **675-*a* through 675-*n* and rows of memory cells 680-*a* through 680-*n*. A section level latch signal (LAT-B) 685 may be provided to latches 675 when a row address is to be latched in order to allow another memory section, such as first memory section 605, to be activated. The first memory section 605 and second memory section 665 may also be coupled with sense amplifier components, a column decoder, and other related input/output components as discussed above in FIG. 1, but which are not illustrated in FIG. 6** for clarity purposes.

When performing a memory access to the first memory section 605, the row address may be provided to row decoder 610 and plate A 635 and wordline (WL) A 640 may be moved from low to high for an initial sense. Digit lines (DL) from the first memory section 605 will move to a value above a reference voltage for memory cells having a stored "1" as indicated at 645, and DLs will move to a value below the reference voltage for memory cells having a stored "0" as indicated at 650. Following the initial sense, the SA circuitry may latch and a SA A line 655 may move from low to high. Following the SA latch, a precharge operation may be performed at the first memory section 605. In this example, first memory section 605 may be independent of second memory section 665, and following a $t_{RP\text{-}fast}$ delay an activation (ACT) may be performed for second memory section 665 during the precharge operation at the first memory section 605. As illustrated in FIG. 6, the ACT command for the second memory section 665 may move plate B 690 and WL B 695 high during the precharge operation at the first memory cell 605. In order to latch the row address at the first memory section 605, section level latch signal LAT A 625 may be moved from a high value to a low value to latch a row address at the first memory section 605 and allow common signals 630 to provide a new row address to the second memory section 665.

While the example of FIG. 6 uses latches to latch an address at a memory section during a precharge operations, other examples may use other techniques to provide a different row address to a subsequent memory section while keeping a prior row address at a prior memory section. For example, an architecture may be provided that includes two sets of wordline, or row, addresses that may be multiplexed in a ping-pong fashion. Such multiplexing would provide different row addresses to the different memory sections and allow the precharge at a first memory section to complete while initiating an ACT command at a second memory section. In some examples, a first section address of a first section of memory cells containing a first memory cell and a second section address of a second section of memory cells containing a second memory cell may be provided to an address decoder associated with each section of memory cells. The address decoder at the first section may multiplex between the first section address and then the second section address, and the address decoder at the second section may multiples between the second section address and then the first section address. The second section may activate during the precharge operation of the first section of memory cells, with each of the first section and second section using the addresses multiplexed at the respective address decoders.

Figure 7:
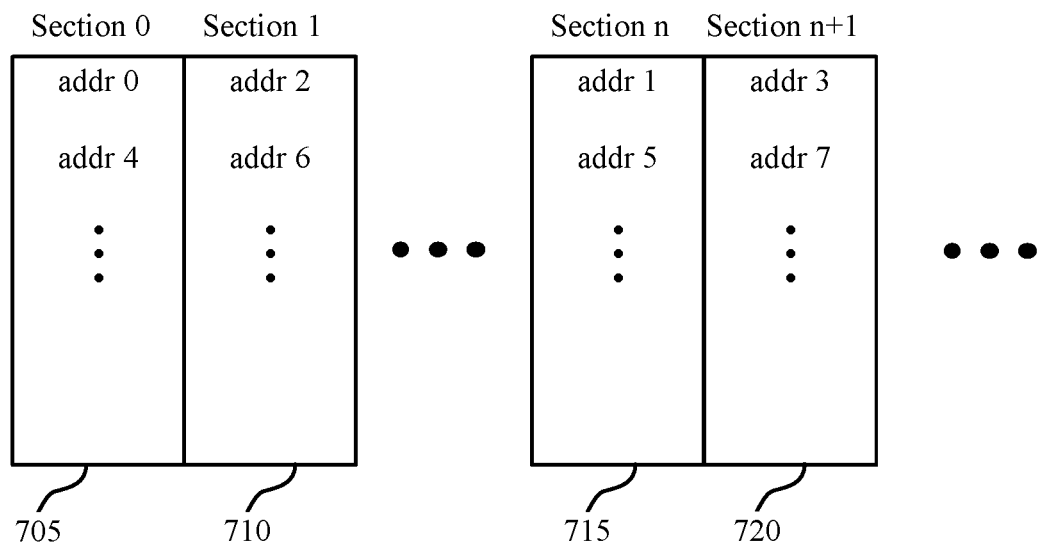
FIG. 7 illustrates an example of address scrambling of consecutive memory addresses to non-consecutive memory sections in accordance with various embodiments of the present disclosure.

FIG. 7 illustrates an example 700 of address scrambling of consecutive memory addresses to non-consecutive memory sections in accordance with various embodiments of the present disclosure. As mentioned above, if consecutive accesses are for memory cells that are independent of one another, a $t_{RP\text{-}fast}$ delay may be used for initiating an activation of a memory section for the next consecutive memory access operation. In order to enhance the likelihood that consecutive memory accesses are for independent memory cells, address scrambling may be implemented to provide that consecutive memory addresses are not in adjacent memory sections. Thus, for example, if a system is reading a group of memory addresses, the likelihood that consecutive memory addresses are located in independent memory sections may be enhanced and a $t_{RP\text{-}fast}$ delay used between accesses more often to thereby enhance the speed of memory operation.

In the example of FIG. 7, memory section 0 705, memory section 1 710, memory section n 715, and memory section n+1 720 are illustrated, although it will be understood that numerous other memory sections may be present. Memory sections 705-720 may be examples of memory array 100, memory sections 505, 510, 525, 555, or 560 of FIG. 5, or memory sections 605 or 665 of FIG. 6, and may include arrays of memory cells such as memory cells 105 of FIGS. 1-2. In this example, a memory address addr 0 may be mapped to memory section 0 705, and consecutive memory address addr 1 may be mapped to memory section n 715. Similarly, memory addresses addr 2 through addr 7 may be mapped such that consecutive memory addresses are not located in adjacent memory sections 705 through 720. In some examples, a controller may select memory addresses for consecutive read/write operations that are not located in a same memory section or adjacent memory sections. In some embodiments, addresses may be mapped to memory sections such that only one (e.g., the first or most significant physical digit line) address bit (0/1 or first-half/second-half) may be sufficient to determine whether the two (logical) addresses are independent. In other examples, different address mapping to memory sections may provide the same or similar benefits.

Figure 8:
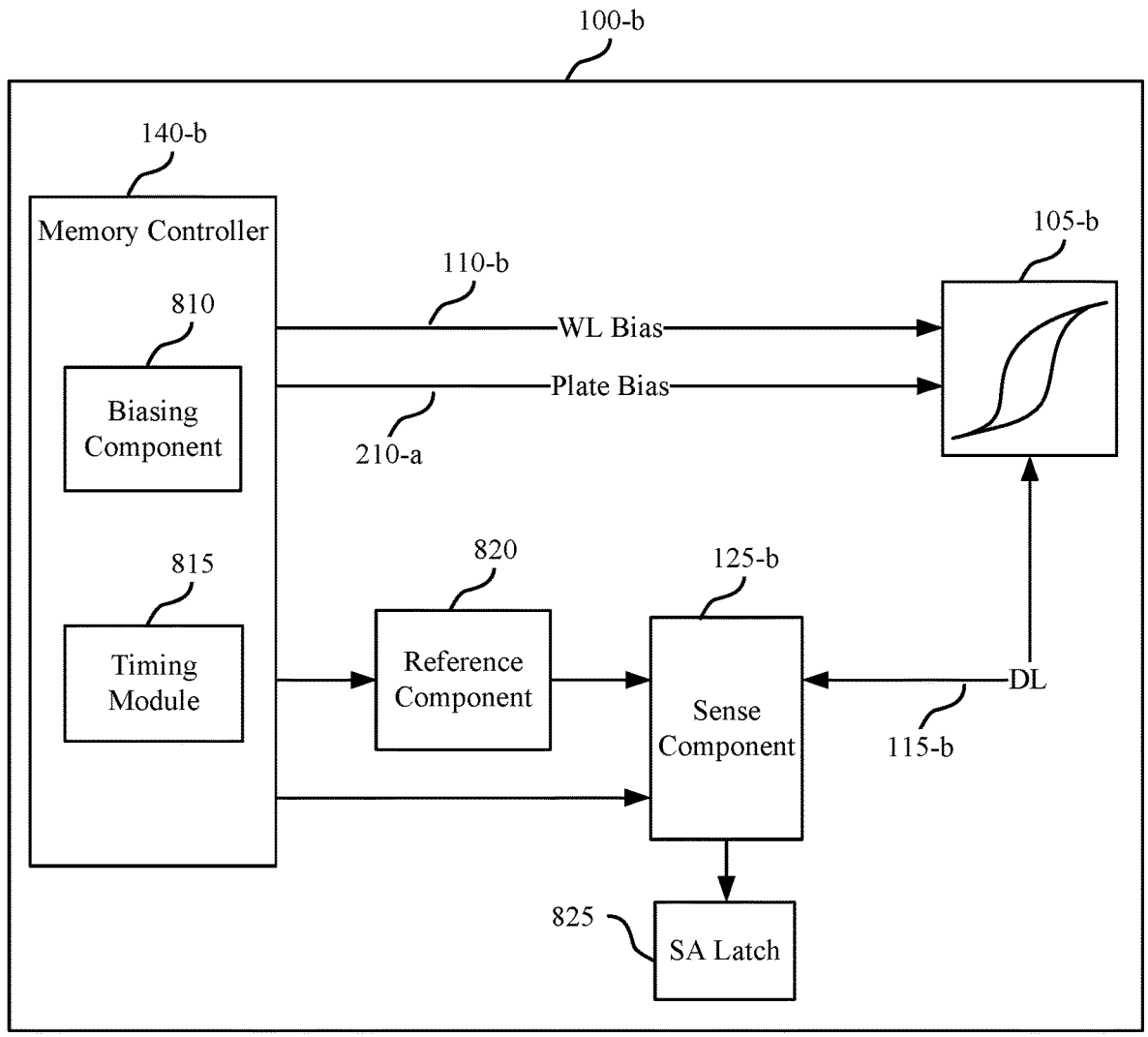
FIG. 8 illustrates a block diagram of an example ferroelectric memory array that supports concurrent access of memory cells within independent sections of a memory array in accordance with various embodiments of the present disclosure.

FIG. 8 shows a block diagram 800 of a memory array **100-*b* that supports concurrent operations at multiple memory sections in accordance with various embodiments of the present disclosure. Memory array 100-*b* may contain memory controller 140-*b* and memory cell 105-*b*, which may be examples of memory controller 140 and memory cell 105 described with reference to FIGS. 1 and 2. Memory controller 140-*b* may include biasing component 810 and timing module 815 and may operate memory array 100-*b* as described in FIGS. 1-7. Memory controller 140-*b* may be in electronic communication with word line 110-*b*, digit line 115-*b*, sense component 125-*b*, and plate 210-*a*, which may be examples of word line 110, digit line 115, sense component 125, and plate 210 described with reference to FIG. 1 or 2. Memory array 100-*b* may also include reference component 820 and SA latch 825. The components of memory array 100-*b* may be in electronic communication with each other and may perform the functions described with reference to FIGS. 1-7. In some cases, reference component 820, sense component 125-*b* and SA latch 825 may be components of memory controller 140-*b***.

Memory controller **140-*b* may be configured to activate word line 110-*b*, plate 210-*a*, or digit line 115-*b* by applying voltages to those various nodes. For example, biasing component 810 may be configured to apply a voltage to operate memory cell 105-*b* to read or write memory cell 105-*b* as described above. In some cases, memory controller 140-*b* may include a row decoder, column decoder, or both, as described with reference to FIG. 1. This may enable memory controller 140-*b* to access one or more memory cells 105. Biasing component 810 may also provide voltage potentials to reference component 820 in order to generate a reference signal for sense component 125-*b*. Additionally, biasing component 810 may provide voltage potentials for the operation of sense component 125**-*b*.

In some cases, memory controller 140-*b* may perform its operations using timing module 815. For example, timing module 815 may control the timing of the various word line selections or plate biasing, including timing for switching and voltage application to perform the memory functions, such as reading/writing and initiating an activation command during a precharge operation, discussed herein. In some cases, timing module 815 may control the operations of biasing component 810.

Reference component 820 may include various components to generate a reference signal for sense component 125-*b*. Reference component 820 may include circuitry specifically configured to produce a reference signal. In some cases, reference component 820 may be other ferroelectric memory cells 105. In some examples, reference component 820 may be configured to output a voltage with a value between the two sense voltages, as described with reference to FIG. 3, 4, or 6. Or reference component 820 may be designed to output a virtual ground voltage.

Sense component 125-*b* may compare a signal from memory cell 105-*b* (through digit line 115-*b*) with a reference signal from reference component 820. Upon determining the logic state, the sense component may then store the output in SA latch 825, where it may be used in accordance with the operations of an electronic device using the memory device of which memory array 100-*b* is a part.

Figure 9:
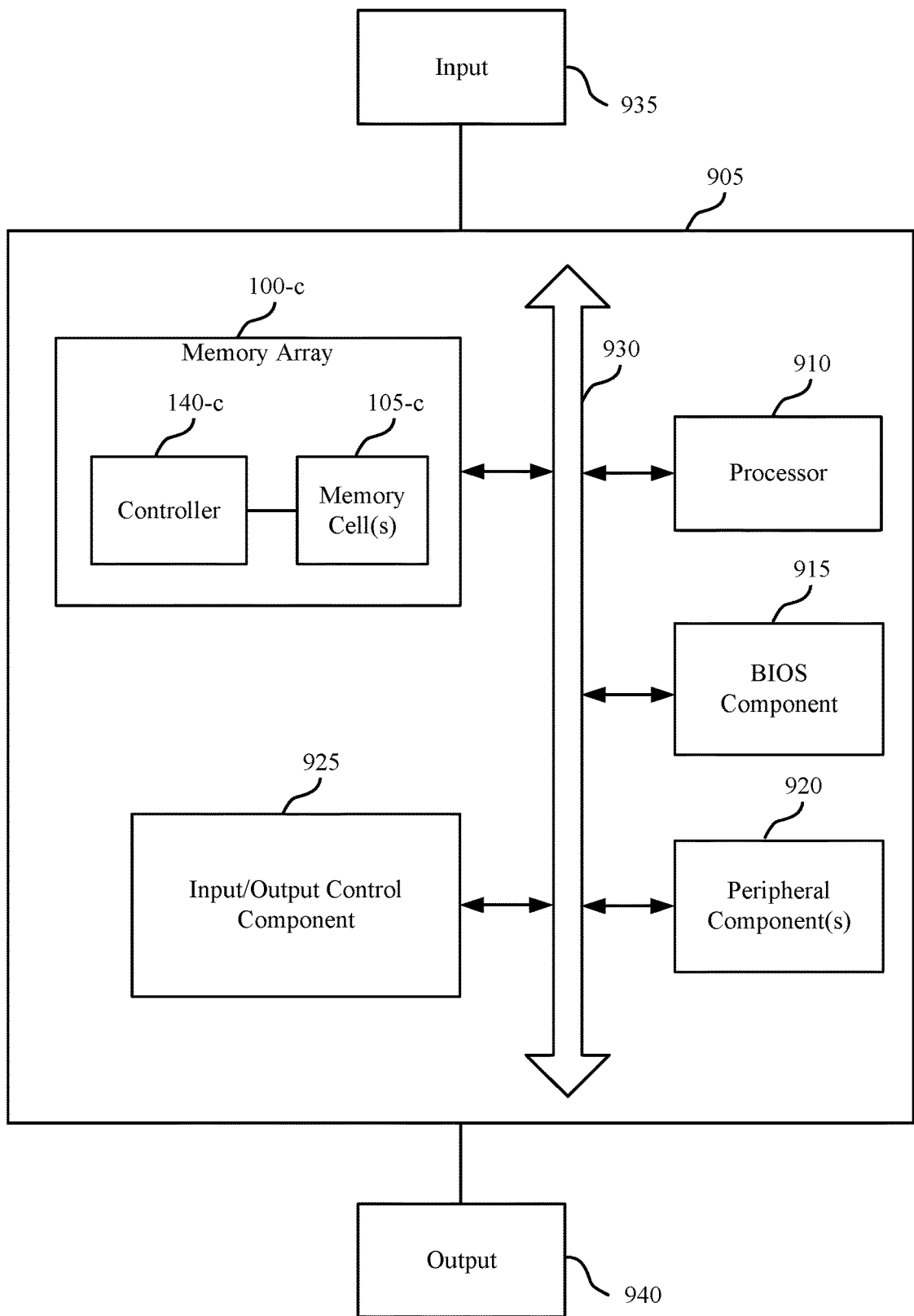
FIG. 9 illustrates a block diagram of a device, including a memory array, that supports concurrent access of memory cells within independent sections of a memory array in accordance with various embodiments of the present disclosure.

FIG. 9 shows a diagram of a system 900 that supports concurrent operations at independent memory sections in accordance with various embodiments of the present disclosure. System 900 may include a device 905, which may be or include a printed circuit board to connect or physically support various components. Device 905 may include a memory array 100-*c*, which may be an example of memory array 100 described in FIGS. 1-8. Memory array 100-*c* may contain memory controller 140-*c* and memory cell(s) 105-*c*, which may be examples of memory controller 140 described with reference to FIGS. 1-8 and memory cells 105 described with reference to FIGS. 1-8. Device 905 may also include a processor 910, BIOS component 915, peripheral component(s) 920, and input/output control component 925. The components of device 905 may be in electronic communication with one another through bus 930.

Processor 910 may be configured to operate memory array 100-*a* through memory controller 140-*c*. In some cases, processor 910 may perform the functions of memory controller 140 described with reference to FIGS. 1-8. In other cases, memory controller 140-*c* may be integrated into processor 910. Processor 910 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 910 may perform various functions described herein, including concurrent operations at independent memory sections. Processor 910 may, for example, be configured to execute computer-readable instructions stored in memory array 100-*a* to cause device 905 perform various functions or tasks.

BIOS component 915 may be a software component that includes a basic input/output system (BIOS) operated as firmware, which may initialize and run various hardware components of system 900. BIOS component 915 may also manage data flow between processor 910 and the various components, e.g., peripheral components 920, input/output controller 925, etc. BIOS component 915 may include a program or software stored in read-only memory (ROM), flash memory, or any other non-volatile memory.

Peripheral component(s) 920 may be any input or output device, or an interface for such devices, that is integrated into device 905. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output controller 925 may manage data communication between processor 910 and peripheral component(s) 920, input devices 935, or output devices 940. Input/output controller 925 may also manage peripherals not integrated into device 905. In some cases, input/output controller 925 may represent a physical connection or port to the external peripheral.

Input 935 may represent a device or signal external to device 905 that provides input to device 905 or its components. This may include a user interface or interface with or between other devices. In some cases, input 935 may be a peripheral that interfaces with device 905 via peripheral component(s) 920 or may be managed by input/output controller 925.

Output device 940 may represent a device or signal external to device 905 configured to receive output from device 905 or any of its components. Examples of output device 940 may include a display, audio speakers, a printing device, another processor or printed circuit board, etc. In some cases, output 940 may be a peripheral that interfaces with device 905 via peripheral component(s) 920 or may be managed by input/output controller 925.

The components of memory controller 140-*c*, device 905, and memory array 100-*c* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 10:
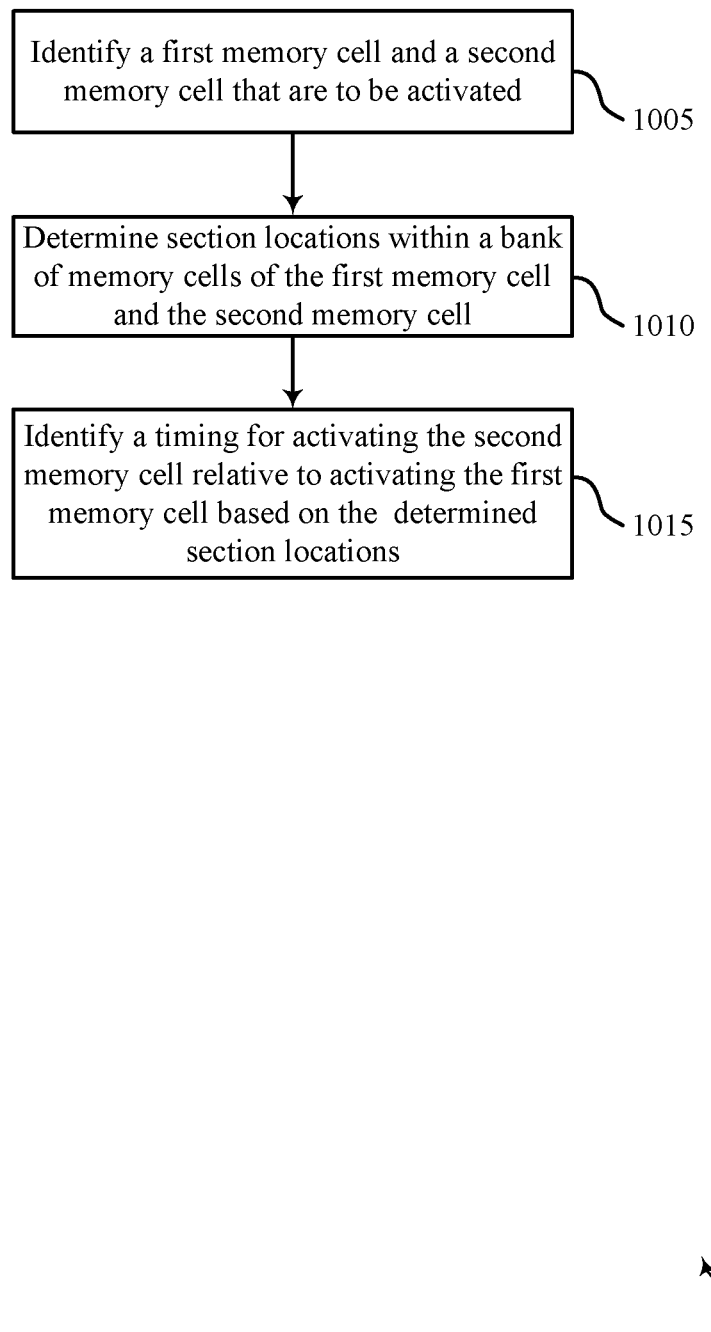
FIGS. 10-12 are flowcharts that illustrate methods for concurrent access of memory cells within independent sections of a memory array in accordance with various embodiments of the present disclosure.

FIG. 10 is a flow chart illustrating an example of a method 1000 for memory device operation, in accordance with various embodiments of the present disclosure. For clarity, the method 1000 is described below with reference to embodiments of one or more of the memory controller 140 or processor 910 described with reference to FIGS. 1-9. In some examples, a memory device may execute one or more sets of codes to control the functional elements of the memory device to perform the functions described below. Additionally or alternatively, the memory device may perform one or more of the functions described below using special-purpose hardware.

At block 1005, the memory device may identify a first memory cell and a second memory cell that are to be activated. Such identification may be made by determining memory addresses for consecutive memory read/write operations, with the first memory cell determined based on a first memory address for a first read/write operation, and the second memory cell determined based on a second memory address for a second read/write operation, for example. The operations of block 1005 may be performed, for example, by controller 140 of FIG. 1, 8 or 9, or by processor 910 of FIG. 9.

At block 1010, the memory device may determine section locations within a bank of memory cells of the first memory cell and the second memory cell. Such a determination may be made by determining section locations within a memory bank for the memory addresses of the first memory cell and second memory cell, for example. The operations of block 1010 may be performed, for example, by controller 140 of FIG. 1, 8 or 9, or by processor 910 of FIG. 9.

At block 1015, the memory device may identify a timing for activating the second memory cell relative to activating the first memory cell based on the determined section locations. The timing may be determined according to the techniques as discussed above with reference to FIGS. 1-8. For example, the timing may be identified to provide activation of the second memory cell concurrently with a precharge operation of the first memory cell. In some examples, activation of the second memory cell may occur following a delay time that is different based on whether the section locations of the first memory cell and the second memory cell are in independent memory sections within the memory device. The operations of block 1015 may be performed, for example, by controller 140 of FIG. 1, 8 or 9, or by processor 910 of FIG. 9.

Figure 11:
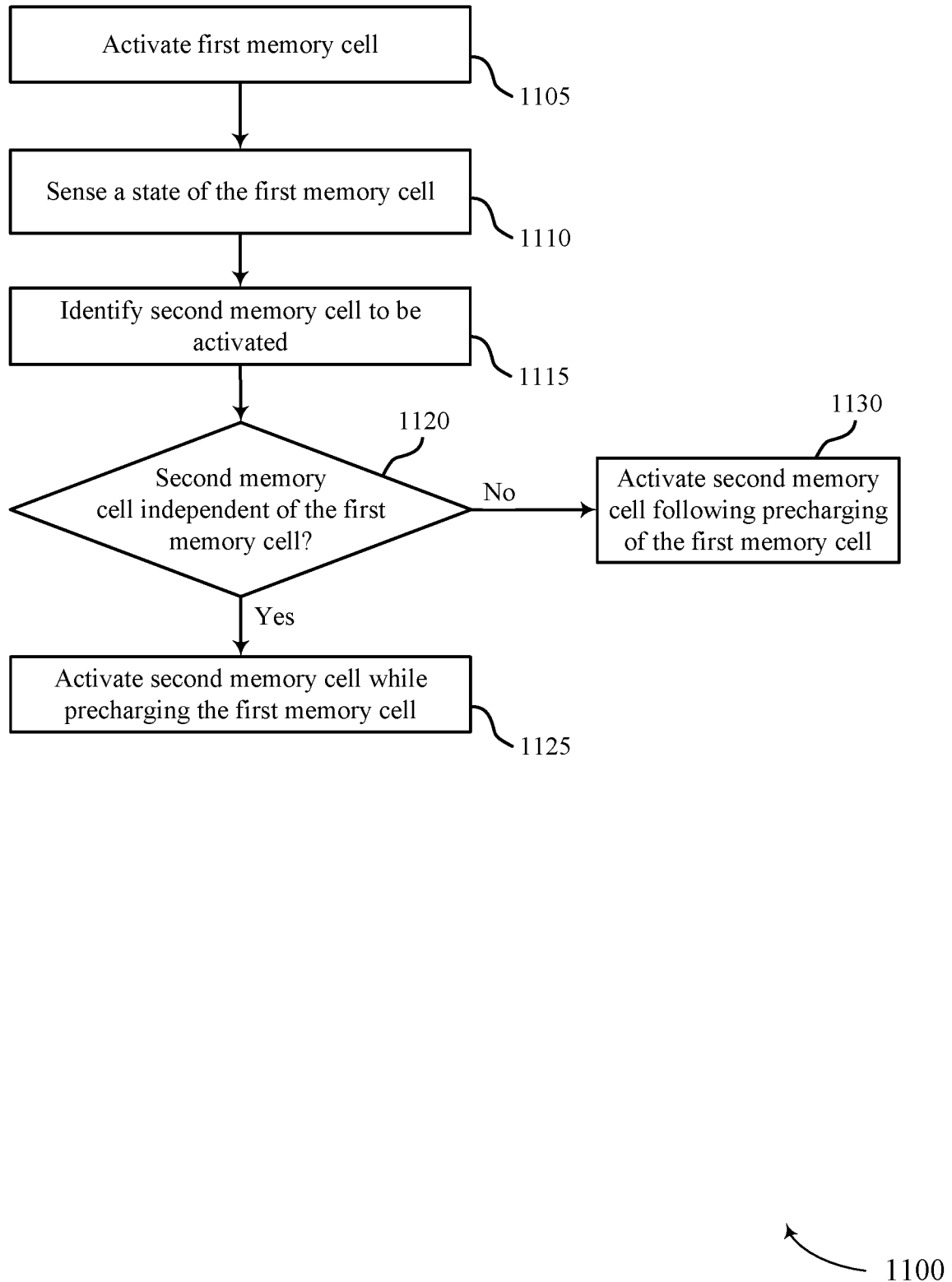

FIG. 11 is a flow chart illustrating an example of a method 1100 for memory device operation, in accordance with various embodiments of the present disclosure. For clarity, the method 1100 is described below with reference to embodiments of one or more of the memory controller 140 or processor 910 described with reference to FIGS. 1-9. In some examples, a memory device may execute one or more sets of codes to control the functional elements of the memory device to perform the functions described below. Additionally or alternatively, the memory device may perform one or more of the functions described below using special-purpose hardware.

At block 1105, the memory device may activate first memory cell. Such activation may be made in response to an access operation that is performed at the first memory cell. The activation of the memory cell may include, for example, moving a plate voltage and/or moving a word line voltage that are provided to the memory cell. The operations of block 1105 may be performed, for example, by controller 140 of FIG. 1, 8 or 9, or by processor 911 of FIG. 9, in conjunction with a cell 105 of FIG. 1-2, 8 or 9.

At block 1110, the memory device may sense a state of the first memory cell. Such sensing may be performed by a sense amplifier component comparing a sensed voltage from a digit line of the first memory cell with a reference voltage. The operations of block 1110 may be performed, for example, by sense component 125 of FIG. 1-2, or 8, of SA components 515, 520, or 565-580 of FIG. 5A or 5B.

At block 1115, the memory device may identify second memory cell to be activated. Such identification may be made by determining a memory address for the second memory cell, for example. The operations of block 1005 may be performed, for example, by controller 140 of FIG. 1, 8 or 9, or by processor 910 of FIG. 9.

At block 1120, the memory device may determine whether the second memory cell is independent of the first memory cell. Such a determination may be based on whether section locations of the first memory cell and the second memory cell are in non-adjacent memory sections within the memory device, for example. If the section locations of the first memory cell and the second memory cell are in non-adjacent memory sections, the first and second memory cells may be determined to not share sense components and thus be independent of each other. The operations of block 1120 may be performed, for example, by controller 140 of FIG. 1, 8 or 9, or by processor 910 of FIG. 9.

If it is determined that the second memory cell is independent of the first memory cell, the memory device may activate the second memory cell while precharging the first memory cell, as indicated at block 1125. Such activation may be initiated, for example, following a first delay time that is set based on the determination that the first memory cell and second memory cell are independent. The operations of block 1130 may be performed, for example, by controller 140 of FIG. 1, 8 or 9, or by processor 910 of FIG. 9.

If it is determined that the second memory cell is not independent of the first memory cell, the memory device may activate the second memory cell following precharging of the first memory cell, as indicated at block 1130. Such activation may be initiated, for example, following a second delay time, that is longer than the first delay time, and that is set based on the determination that the first memory cell and second memory cell are not independent. The operations of block 1130 may be performed, for example, by controller 140 of FIG. 1, 8 or 9, or by processor 910 of FIG. 9.

Figure 12:
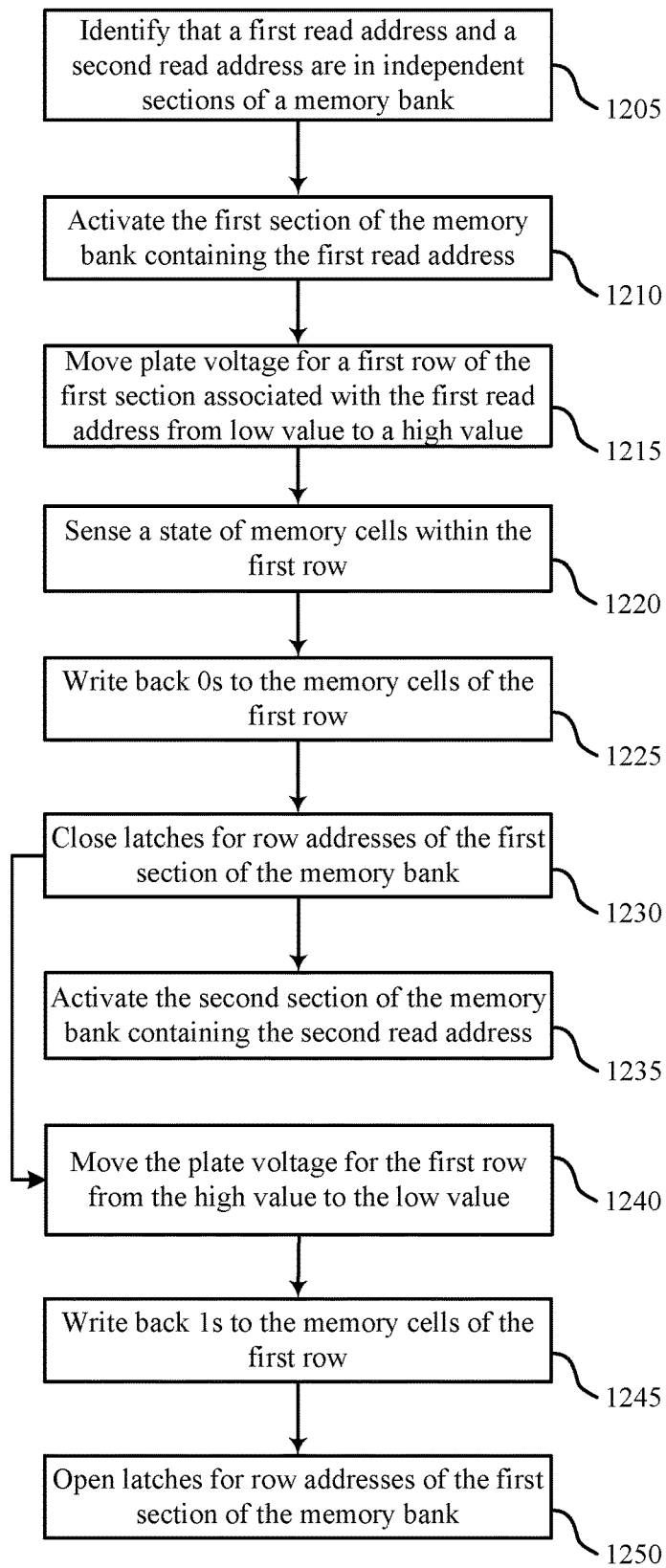

FIG. 12 is a flow chart illustrating an example of a method 1200 for memory device operation, in accordance with various embodiments of the present disclosure. For clarity, the method 1200 is described below with reference to embodiments of one or more of the memory controller 140 or processor 910 described with reference to FIGS. 1-9. In some examples, a memory device may execute one or more sets of codes to control the functional elements of the memory device to perform the functions described below. Additionally or alternatively, the memory device may perform one or more of the functions described below using special-purpose hardware.

At block 1205, the memory device may identify that a first read address and a second read address are in independent sections of a memory bank. Such identification may be made by determining, for example, that the memory bank sections of the first read address and the second read address are not adjacent to each other. The operations of block 1205 may be performed, for example, by controller 140 of FIG. 1, 8 or 9, or by processor 912 of FIG. 9.

At block 1210, the memory device may activate the first section of the memory bank containing the first read address. Such activation may include, as indicated at block 1215, moving a plate voltage for a first row of the first section associated with the first read address from low value to a high value. The operations of block 1210-1215 may be performed, for example, by controller 140 of FIG. 1, 8 or 9, or by processor 912 of FIG. 9, in conjunction with a cell 105 of FIG. 1-2, 8 or 9.

At block 1220, the memory device may sense a state of memory cells within the first row. Such sensing may be performed by a sense amplifier component comparing a sensed voltage from a digit line of the first memory cell with a reference voltage. The operations of block 1220 may be performed, for example, by sense component 125 of FIG. 1-2, or 8, of SA components 515, 520, or 565-580 of FIG. 5A or 5B.

At block 1225, the memory device may write back 0s to the memory cells of the first row. Such write back may be performed by biasing the plate and digit lines to polarize the memory cells. The operations of block 1225 may be performed, for example, by controller 140 of FIG. 1, 8 or 9, or by processor 910 of FIG. 9, in conjunction with a cell 105 of FIG. 1-2, 8 or 9.

At block 1230, the memory device may close latches for row addresses of the first section of the memory bank. Such latches may allow the first section to complete a precharge command while a second row address is provided to a different section for a subsequent access operation. The operations of block 1230 may be performed, for example, by controller 140 of FIG. 1, 8 or 9, or by processor 910 of FIG. 9, in conjunction with latches 145 of FIG. 1 or latches 615 or 675 of FIG. 6.

At block 1235, the memory device may activate the second section of the memory bank containing the second read address. Such activation may include moving a plate voltage for a second row of the second section associated with the second read address from low value to a high value. The operations of block 1235 may be performed, for example, by controller 140 of FIG. 1, 8 or 9, or by processor 912 of FIG. 9, in conjunction with a cell 105 of FIG. 1-2, 8 or 9.

At block 1240, the memory device may, concurrently with the operations of block 1235, move the plate voltage for the first row from the high value to the low value. The operations of block 1240 may be performed, for example, by controller 140 of FIG. 1, 8 or 9, or by processor 912 of FIG. 9, in conjunction with a cell 105 of FIG. 1-2, 8 or 9.

At block 1245, the memory device may write back is to the memory cells of the first row. Such write back may be performed by biasing the plate and digit lines to polarize the memory cells. The operations of block 1245 may be performed, for example, by controller 140 of FIG. 1, 8 or 9, or by processor 910 of FIG. 9, in conjunction with a cell 105 of FIG. 1-2, 8 or 9.

At block 1250, the memory device may open latches for row addresses of the first section of the memory bank. Opening the latches may allow the first section to receive a subsequent row address for a subsequent memory access operation following completion of the precharge. The operations of block 1250 may be performed, for example, by controller 140 of FIG. 1, 8 or 9, or by processor 910 of FIG. 9, in conjunction with latches 145 of FIG. 1 or latches 615 or 675 of FIG. 6.

Thus, methods 1000, 1100, and 1200 may provide for concurrent operations at independent memory sections and thereby enhance efficiency of a memory device. It should be noted that methods 1000, 1100, and 1200 describe possible implementations, and the operations and steps may be rearranged or otherwise modified such that other implementations are possible. In some examples, aspects from two or more of the methods 1000, 1100, and 1200 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example" and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   initiating a first activation operation for a first set of memory cells within a first section of a bank of a memory array;
   initiating a precharge operation for the first set of memory cells after the first activation operation is complete;
   latching, by one or more latches coupled with the first section of the bank, an address associated with the first set of memory cells before completing the precharge operation for the first set of memory cells;
   initiating a second activation operation for a second set of memory cells within a second section of the bank of the memory array before completing the precharge operation for the first set of memory cells; and
   completing the precharge operation for the first set of memory cells, based at least in part on latching the address associated with the first set of memory cells, after initiating the second activation operation.

2. The method of claim 1, further comprising:
   receiving, at the one or more latches, a signal indicating to latch the address associated with the first set of memory cells, wherein latching the address associated with the first set of memory cells is based at least in part on receiving the signal.

3. The method of claim 1, further comprising:
   receiving, via a bus, the address associated with the first set of memory cells at a first address decoder coupled with the first set of memory cells, wherein executing the first activation operation is based at least in part on receiving the address at the first address decoder; and
   receiving, via the bus, a second address associated with the second set of memory cells at a second address decoder coupled with the second set of memory cells before completing the precharge operation for the first set of memory cells, wherein executing the second activation operation is based at least in part on receiving the second address at the second address decoder.

4. The method of claim 3, further comprising:
   receiving, via the bus, the address associated with the first set of memory cells at the second address decoder; and
   receiving, via the bus, the second address associated with the second set of memory cells at the first address decoder.

5. The method of claim 3, wherein the second address is received at the second address decoder after the address associated with the first set of memory cells is latched by the one or more latches.

6. The method of claim 1, further comprising:
   closing the one or more latches, wherein latching the address associated with the first set of memory cells is based at least in part on closing the one or more latches.

7. The method of claim 2, further comprising:
opening the one or more latches after completing the precharge operation for the first set of memory cells.

8. The method of claim 1, further comprising:
completing a write-back operation for at a least a first memory cell in the first set of memory cells after the initiating the second activation operation.

9. The method of claim 8, further comprising:
initiating a write-back operation for at least a second memory cell in the first set of memory cells before latching the address associated with the first set of memory cells.

10. The method of claim 1, further comprising:
identifying that the first section of the bank is independent of the second section of the bank based at least in part on the first section of the bank and the second section of the bank being coupled with different sense components.

11. An apparatus, comprising:
a bank of a memory array comprising a first section of memory cells and a second section of memory cells;
one or more latches coupled with the first section of memory cells; and
a controller coupled with the bank, the controller configured to cause the apparatus to:
initiate a first activation operation for a first set of memory cells within the first section of the bank;
initiate a precharge operation for the first set of memory cells after the first activation operation is complete;
latch, by the one or more latches, an address associated with the first set of memory cells before completing the precharge operation for the first set of memory cells;
initiate a second activation operation for a second set of memory cells within the second section of the bank before completing the precharge operation for the first set of memory cells; and
complete the precharge operation for the first set of memory cells, based at least in part on latching the address associated with the first set of memory cells, after initiating the second activation operation.

12. The apparatus of claim 11, wherein:
the one or more latches are configured to latch the address associated with the first set of memory cells based at least in part on receiving, before the precharge operation for the first set of memory cells is completed, a signal indicating to latch the address.

13. The apparatus of claim 11, further comprising:
a first address decoder for the first section of the bank;
a second address decoder for the second section of the bank; and
a bus coupled with the first address decoder and the second address decoder, wherein the controller is further configured to:
cause the first address decoder to receive, via the bus, the address associated with the first set of memory cells, wherein the apparatus is configured to execute the first activation operation based at least in part on the address being received at the first address decoder; and
cause the second address decoder to receive, via the bus, a second address associated with the second set of memory cells before the precharge operation for the first set of memory cells is complete, wherein the apparatus is configured to execute the second activation operation based at least in part on the second address being received at the second address decoder.

14. The apparatus of claim 13, wherein the controller is configured to cause the second address decoder to receive the second address after the address associated with the first set of memory cells is latched by the one or more latches.

15. The apparatus of claim 11, wherein the controller is further configured to cause the apparatus to:
complete a write-back operation for at least a first memory cell in the first set of memory cells after the initiating the second activation operation.

16. The apparatus of claim 15, wherein the controller is further configured to cause the apparatus to:
initiate a write-back operation for at least a second memory cell in the first set of memory cells before latching the address associated with the first set of memory cells.

17. The apparatus of claim 11, further comprising:
a first sense component coupled with the first section of the bank; and
a second sense component coupled with the second section of the bank, wherein the second section of the bank is independent of the first section of the bank based at least in part on the second sense component being different than the first sense component.

18. A method, comprising:
identifying a first set of memory cells to access and a second set of memory cells to access, wherein the first set of memory cells are within a first section of a bank of a memory array and the second set of memory cells are within a second section of the bank, the second section independent of the first section;
activating a first word line within the first section and coupled with the first set of memory cells;
sensing respective states of the first set of memory cells while the first word line is activated;
initiating a first write-back operation for a first subset of memory cells within the first set of memory cells after the respective states of the first subset of memory cells are sensed;
latching, by one or more latches coupled with the first set of memory cells, an address associated with the first set of memory cells after initiating the first write-back operation;
activating a second word line within the second section and coupled with the second set of memory cells after latching the address associated with the first set of memory cells; and
completing, after activating the second word line, a second write-back operation for a second subset of memory cells within the first set of memory cells.

19. The method of claim 18, further comprising:
closing the one or more latches to latch the address associated with the first set of memory cells; and
opening the one or more latches after completing the second write-back operation.

20. The method of claim 18, further comprises:
receiving, at the one or more latches after activating the first word line, a signal indicating to latch the address associated with the first set of memory cells, wherein latching the address is based at least in part on receiving the signal at the one or more latches.

* * * * *